(12) United States Patent
Wingett et al.

(10) Patent No.: US 6,948,377 B2
(45) Date of Patent: Sep. 27, 2005

(54) METHOD AND APPARATUS FOR DETECTING THE STRAIN LEVELS IMPOSED ON A CIRCUIT BOARD

(75) Inventors: Paul T. Wingett, Mesa, AZ (US);
Calvin C. Potter, Mesa, AZ (US);
Brent L. Bristol, Phoenix, AZ (US)

(73) Assignee: Honeywell International, Inc., Morristown, NJ (US)

( * ) Notice: Subject to any disclaimer, the term of this patent is extended or adjusted under 35 U.S.C. 154(b) by 0 days.

(21) Appl. No.: 10/730,410

(22) Filed: Dec. 8, 2003

(65) Prior Publication Data

US 2005/0120807 A1    Jun. 9, 2005

(51) Int. Cl.⁷ .............................................. G01N 3/00
(52) U.S. Cl. ...................................................... 73/795
(58) Field of Search ....................... 73/768, 769, 774, 73/775, 778, 788, 795

(56) References Cited

U.S. PATENT DOCUMENTS

| | | | |
|---|---|---|---|
| 3,387,120 A | 6/1968 | Funk et al. | |
| 3,733,424 A | 5/1973 | Pitts et al. | |
| 4,336,595 A | 6/1982 | Adams et al. | |
| 4,908,576 A * | 3/1990 | Jackson | 714/726 |
| 5,127,009 A * | 6/1992 | Swanson | 714/734 |
| 5,195,046 A | 3/1993 | Gerardi et al. | |
| 5,567,884 A * | 10/1996 | Dickinson et al. | 73/814 |
| 5,587,535 A | 12/1996 | Sasaki et al. | |
| 5,734,110 A | 3/1998 | Kosmal | |
| 5,969,260 A | 10/1999 | Belk et al. | |
| 6,020,751 A * | 2/2000 | Rampone et al. | 324/765 |
| 6,195,082 B1 | 2/2001 | May et al. | |
| 6,553,846 B2 | 4/2003 | Mattes | |
| 6,806,718 B2 * | 10/2004 | Berkely | 324/500 |
| 2002/0017131 A1 | 2/2002 | Ueyanagi et al. | |

FOREIGN PATENT DOCUMENTS

JP    02001015882 A    1/2001

OTHER PUBLICATIONS

Juvinall, Robert C., "Electric-Resistance Strain Gages", 1967, Engineering Considerations of Stress, Strain, and Strength, p.503-505.

* cited by examiner

*Primary Examiner*—Max Noori
(74) *Attorney, Agent, or Firm*—Ingrassia Fisher & Lorenz

(57) ABSTRACT

A device for detecting strain levels imposed on a circuit board includes an apparatus mounted on the circuit board, an amplifier for detecting a change in the impedance of the apparatus and generating an output signal representing the change in the impedance of the apparatus, and a signal conditioner for receiving the output signal and setting the gain of the amplifier.

19 Claims, 3 Drawing Sheets

METHOD AND APPARATUS FOR DETECTING THE STRAIN LEVELS IMPOSED ON A CIRCUIT BOARD

BACKGROUND OF THE INVENTION

1. Field of the Invention

The present invention relates generally to in situ detection of the strain levels imposed on components, and more particularly to an apparatus for detecting the strain levels imposed on a circuit board.

2. Description of the Related Art

Many components (e.g., a circuit board or printed wire board) are exposed to high strain levels caused by normal and unanticipated movements of the components during use. For example, these components may be used on aircrafts, automobiles, vehicles, home appliances, spacecrafts and various electromechanical (EM) devices. The high strain levels cause the components to crack, break or fail to perform. That is, after a finite amount of time, the components may crack, break or fail causing the system to fail or malfunction. For example, high strain levels produced on a circuit board may cause the electronic components on the circuit board to malfunction.

Some devices have been used to detect the presence of strain levels imposed on the components. For example, accelerometers have been used to detect the presence of strain levels. In one configuration, an accelerometer may be placed on a housing that contains the components to measure the strain levels imposed on the components. Receiving these measurements, however, does not provide a very accurate measurement because the accelerometer is measuring the movement of the housing rather than the movement of the components. Therefore, an accurate measurement may not be obtained unless the accelerometer is placed on each system component within the housing, which is costly, inefficient and impractical.

A sensor device can be used to detect structural defects in a work piece by monitoring the electrical continuity of thin crack wires deposited on or within the work piece. The sensor device includes a discontinuity sensor that applies a voltage to one end of the crack wire and monitors the voltage level at the other end of the crack wire to determine if the crack wire is broken, thereby indicating the presence of a crack, delamination or other defect. One drawback of this sensor device is that the work piece must include many thin crack wires in order to detect damage to different parts of the work piece.

Thus, it should be appreciated that there is a need for providing economical and effective real-time data on the strain levels imposed on circuit boards in use. The present invention fulfills this need as well as others.

SUMMARY OF THE INVENTION

The invention relates to a device for detecting strain levels imposed on a circuit board. In particular, and by way of example only, one embodiment of the invention is a device including an apparatus mounted on the circuit board, an amplifier for detecting a change in the impedance of the apparatus and generating an output signal representing the change in the impedance of the apparatus, and a signal conditioner for receiving the output signal and setting the gain of the amplifier.

One embodiment of the invention is a system for monitoring the strain levels at particular locations on a circuit board located on an aircraft. The system may include a strain indicator embedded into a layer of the circuit board, an operational amplifier, mounted on the circuit board, for detecting a change in the resistance of the strain indicator and generating an output signal representing the change in the resistance of the strain indicator and a signal conditioner, mounted on the circuit board, for receiving the output signal and transmitting the output signal to a cockpit of an aircraft, a data acquisition device, an end user or a trend monitor computer.

One embodiment of the invention is a method for monitoring the strain level of a circuit board located on an aircraft. The method may include performing a vibration analysis on the circuit board to identify at least one position on the circuit board experiencing a large amount of strain during operation of the aircraft and positioning a trace on the circuit board at the at least one position identified by the vibration analysis. The method may also include detecting changes in the resistance of the trace using an amplifier, generating an output signal based on the changes in the resistance of the trace and transmitting the output signal to the cockpit of the aircraft.

These and other features and advantages of the embodiments of the invention will become apparent from the following detailed description, taken in conjunction with the accompanying drawings, which illustrate, by way of example the principles of the invention.

DETAILED DESCRIPTION OF THE PRESENTLY PREFERRED EMBODIMENTS

Methods and devices that implement the embodiments of the various features of the invention will now be described with reference to the drawings. The drawings and the associated descriptions are provided to illustrate embodiments of the invention and not to limit the scope of the invention. Reference in the specification to "one embodiment" or "an embodiment" is intended to indicate that a particular feature, structure, or characteristic described in connection with the embodiment is included in at least an embodiment of the invention. The appearances of the phrase "in one embodiment" in various places in the specification are not necessarily all referring to the same embodiment. Throughout the drawings, reference numbers are re-used to indicate correspondence between referenced elements. In addition, the first digit of each reference number indicates the figure in which the element first appears.

Figure 1:
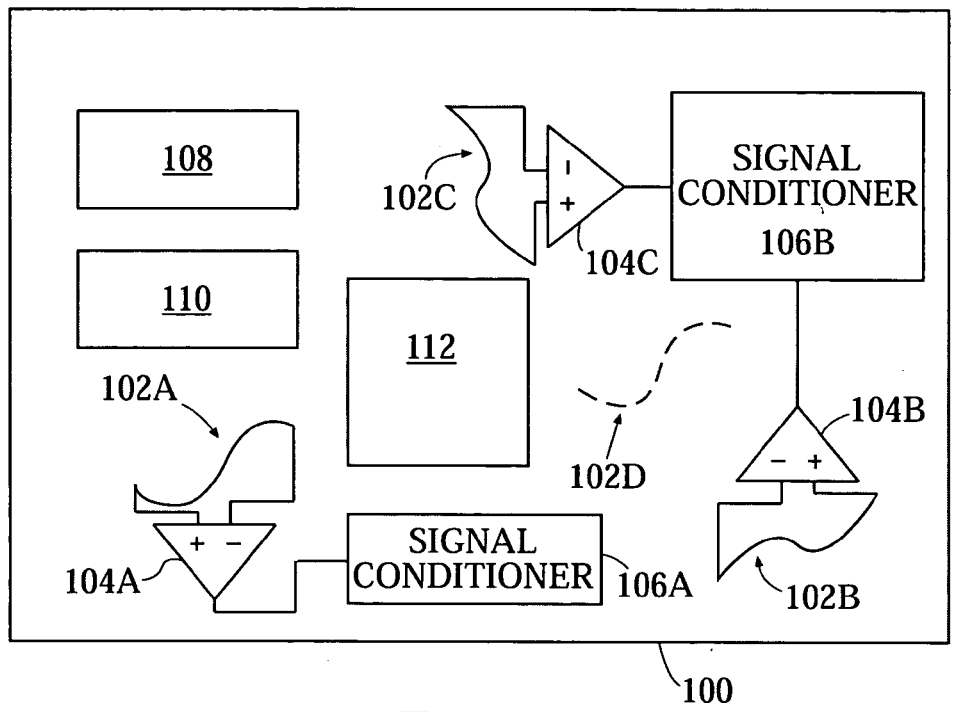
FIG. 1 is a simplified block diagram illustrating a circuit board, an apparatus for detecting strain levels imposed on the circuit board, an amplifier and a signal conditioner mounted on the circuit board according to an embodiment of the invention.

Referring now more particularly to the drawings, FIG. 1 is a simplified block diagram illustrating a circuit board (e.g., printed wire board, ceramic board or multi-chip modules) 100, an apparatus 102 mounted on or embedded in the circuit board 100, an amplifier 104 (e.g., a surface mount operational amplifier) mounted on the circuit board 100 for detecting strain levels imposed on the circuit board 100 and a signal conditioner 106 mounted on the circuit board 100. The signal conditioner 106 may include capacitors and resistors for adjusting or setting the gain of the output signal received from the amplifier 104. The signal conditioner 106 provides real-time feedback and system monitoring information to the receiving device (e.g., an aircraft cockpit) regarding the amount of strain being imposed on various locations of the circuit board 100. Depending on the specific application, the circuit board 100 may also include a number of other semiconductor chips such as an analog-to-digital converter 108, a filter 110, a digital signal processor 112 or any other chips or components mounted thereon. The circuit board 100 is capable of allowing semiconductors chips to be fabricated or mounted thereon.

Figure 2:
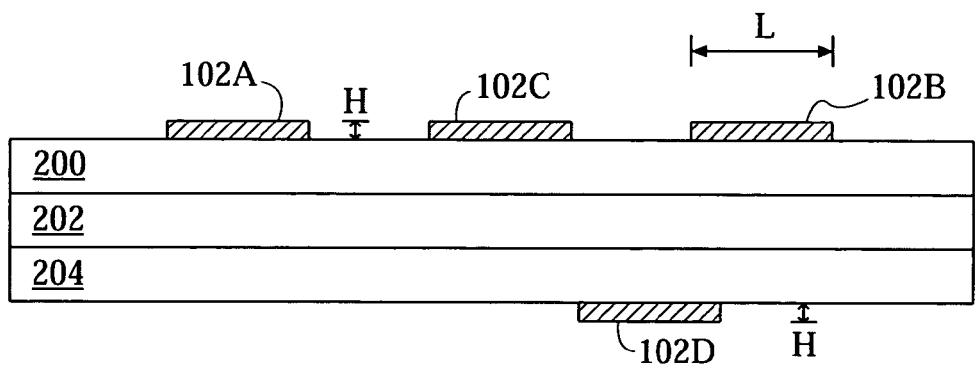
FIG. 2 is a side view of the circuit board having a number of layers stacked on one another according to an embodiment of the invention.

FIG. 2 is a side view of the circuit board 100 having a number of layers stacked or fabricated on one another. For illustrative purposes, the circuit board 100 includes top, center and bottom layers 200, 202, 204 that are fabricated or joined together. The layers are generally made of an epoxy-glass composite material. In one embodiment, the semiconductor chips (not shown) and the apparatus 102 are embedded or mounted on the top and bottom layers 200, 204. The apparatus 102 can have varying lengths, widths and heights depending on the vibration analysis and/or the available space on the circuit board 100. In one embodiment, each apparatus 102 has a length L of about 25.4 millimeters, a width W of about 1.0 micron and a height H of about 6.35 millimeters. The number of apparatus 102 located on the top and bottom layers 200, 204 depends on the vibration analysis performed on the circuit board 100 and/or the available space on the circuit board 100.

Prior to determining the number of apparatus 102 and the placement of each apparatus 102, a vibration analysis is performed on the circuit board 100 to locate the positions on the circuit board 100 experiencing the greatest amount of strain during operation of the aircraft. An example of a simulation software program that can perform a vibration analysis is ANSYS created by ANSYS, Inc. of Canonsburg, Pa. Using the simulation software program, an engineer or technician can perform a modal analysis on the circuit board 100 to identify the locations on the circuit board 100 experiencing relatively high strain levels and the natural frequencies at which those strain levels occur. That is, the modal analysis identifies peak displacements on the circuit board 100. Once the modal analysis identifies the locations, the apparatus 102 is positioned or mounted at one or more locations.

Figure 3:
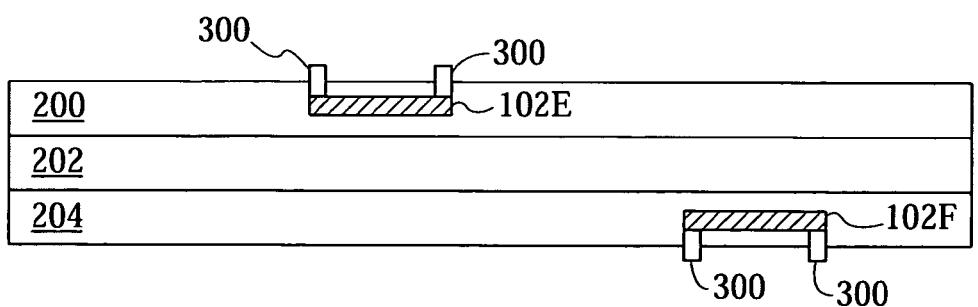
FIG. 3 is a cross-sectional side view of the circuit board showing a number of layers joined together where an apparatus is embedded into the top layer and an apparatus is embedded into the bottom layer according to an embodiment of the invention.

FIG. 3 is a cross-sectional side view of the circuit board 100 having a number of layers stacked on one another where the apparatus 102e is embedded into the top layer 200 and the apparatus 102f is embedded into the bottom layer 204. When the apparatus 102 are embedded into the top layer and/or the bottom layer of the circuit board 100, a human is unable to see the apparatus 102. That is, a person viewing the circuit board 100 will not be able to see the apparatus 102 because they are embedded into the layers of the circuit board 100. Embedding the apparatus 102 into the top layer 200 and/or the bottom layer 204 advantageously saves a large amount of space on the circuit board 100. Therefore, a greater number of semiconductor chips can be positioned on the circuit board 100 while still be able to detect strain levels using the apparatus 102.

Each end of the embedded apparatus 102 may be connected to a metallic member 300 that is used to provide a connection to the semiconductor chips (not shown) that are mounted on the top and bottom layers 200, 204. That is, each metallic member 300 may be used to connect the apparatus 102 to the semiconductor chip. In one embodiment, each end of the apparatus 102 may be connected to the amplifier 104 as shown in FIG. 1. In one embodiment, each end of the apparatus 102 may be connected to the signal conditioner 106. The amplifier 104 and the signal conditioner 106 may be part of a single module rather than two separate components.

Figure 4:
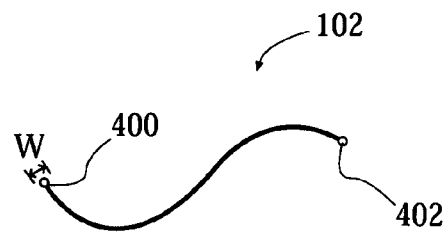
FIG. 4 is an exploded top view of the apparatus in the shape of a lazy S according to an embodiment of the invention.
Figure 5A:
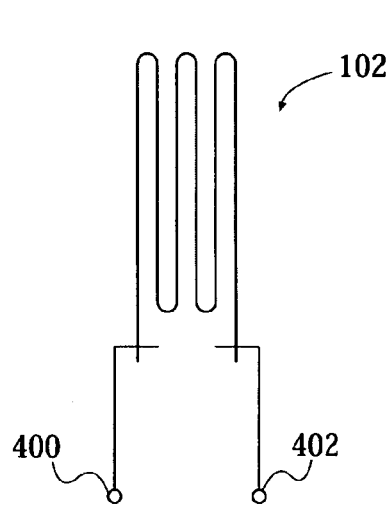
FIGS. 5A–5D are exploded top views of the trace having curve, semi-circle, arc and zig-zag shapes according to an embodiment of the invention.
Figure 5B:
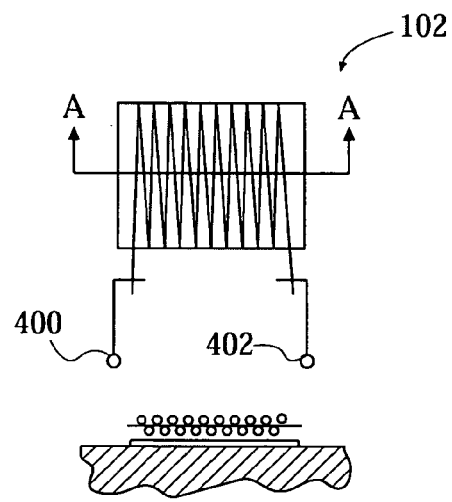
Figure 5C:
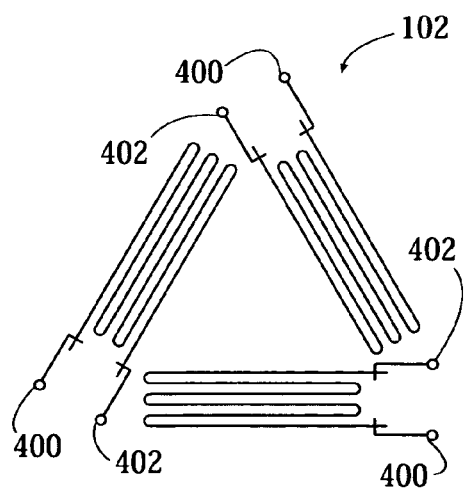
Figure 5D:
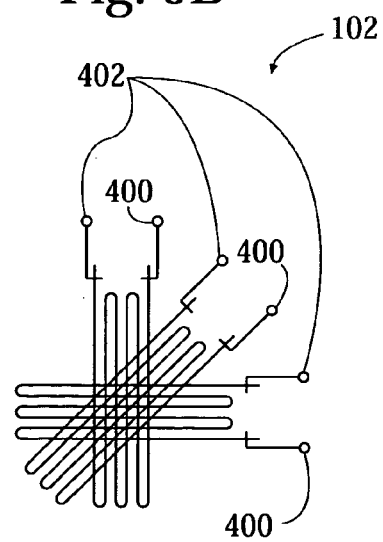
Figure 6A:
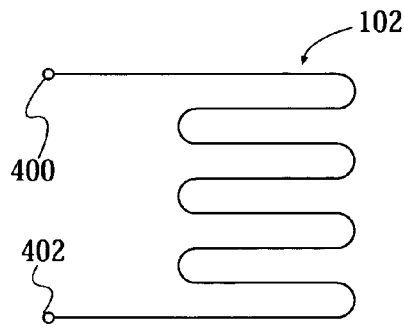
FIGS. 6A–6D are exploded top views of the trace having curve, semi-circle, arc and zig-zag shapes according to an embodiment of the invention.
Figure 6B:
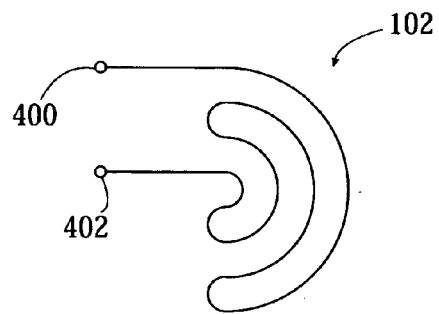
Figure 6C:
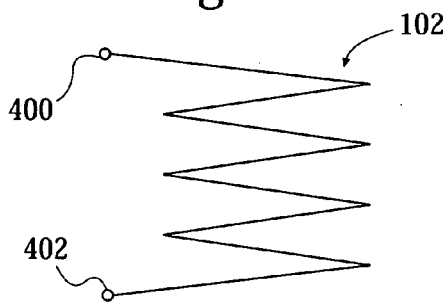
Figure 6D:
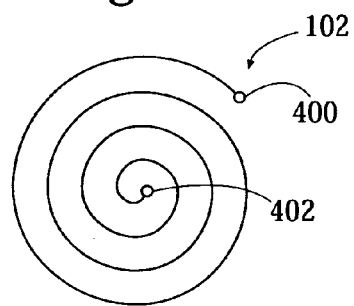

FIG. 4 is an exploded top view of the apparatus 102. Preferably, the apparatus 102 is a trace made of a metallic material (e.g., a copper clad material) and has a lazy "S" shape as shown in FIG. 4. The apparatus 102 can also be formed in the shape of a single flat grid (FIG. 5A), flattened helix or wraparound grid (FIG. 5B), equiangular rosette with adjacent elements (delta rosette) (FIG. 5C), rectangular rosette with layered elements (FIG. 5D) or any other shape that decreases the impedance (e.g., resistance) when subject to a compressive stress and increases the impedance when subject to a tensile stress. One end 400 of the apparatus 102 is connected to the positive terminal of the amplifier 104 and another end 402 of the apparatus 102 is connected to the negative terminal of the amplifier 104. FIGS. 6A–6D are exploded top views of the apparatus 102 having a fork shape (FIG. 6A), a semi-circular shape (FIG. 6B), a zig-zag shape (FIG. 6C) and a spiral shape (FIG. 6D). In one embodiment, the apparatus 102 can be a strain gage or a strain indicator integrated with the circuit board 100. In one embodiment, the apparatus 102 can be a semiconductor chip capable of sensing stresses and strains imposed on the circuit board 100.

The apparatus 102 is oriented on the circuit board 100 at locations that experience the greatest amount of stress and strain conditions. That is, the apparatus 102 is positioned or mounted so that the apparatus 102 is compressed or stretched as much as possible during strain cycles of the circuit board 100, thus resulting in a detectable change in the impedance. Strains on the apparatus 102 cause the impedance of the apparatus 102 to change allowing the amplifier 104 to detect these changes. In one embodiment, the apparatus 102 is oriented along a primary axis of the strain of the circuit board 100. The non-linear shape of the traces allows the traces to be subjected to significant strains in an orthogonal direction resulting in greater changes in the resistance and voltage being detected by the amplifier 104. When the circuit board 100 is subjected to strain, the impedance of the apparatus 102 changes, which is detected by the amplifier 104. The amplifier 104 generates an output signal representing the change in the impedance of the apparatus that is sent to the signal conditioner 106. The signal conditioner 106 receives the output signal, which indicates actual strain levels imposed on the circuit board 100 and sends the output signal to a receiving device (e.g., a computer) for real-time diagnostics. The unit of measure for the output signal may be volts per inch or volts per millimeter.

Figure 7A:
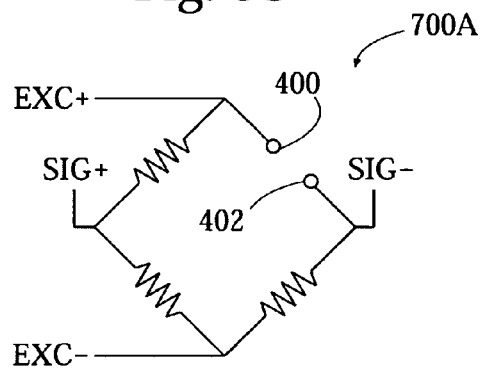
FIGS. 7A–7C illustrates various bridge networks that are coupled to the apparatus and the amplifier according to an embodiment of the invention.
Figure 7B:
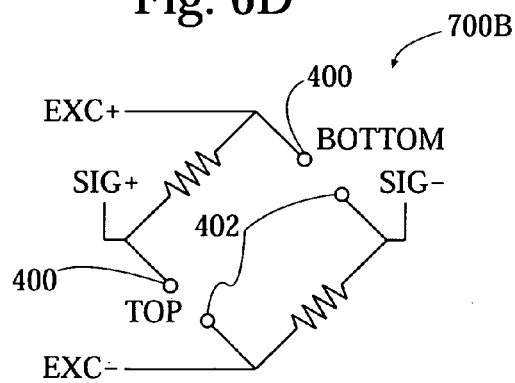
Figure 7C:
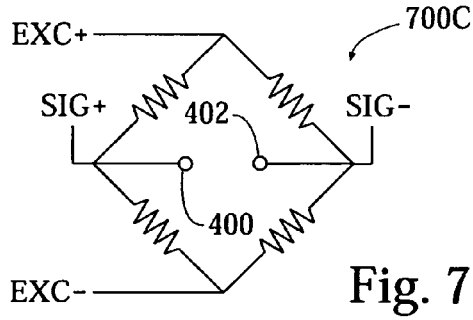

FIGS. 7A–7C illustrates various bridge (or resistor) networks 700 that are coupled to the apparatus 102 and the amplifier 104. The bridge networks 700 provide signal conditioning for the apparatus 102. The apparatus 102 shown in FIGS. 5 and 6 can be connected to the bridge network 700 at ends 400, 402. The EXC+ terminal is connected to a reference voltage (e.g., 10 volts) and the EXC− terminal is connected to ground. The SIG+ terminal is connected to the positive terminal of the amplifier 104 and the SIG− terminal is connected to the negative terminal of the amplifier 104. The amplifier 104 receives from the bridge network 700, an output voltage representing the strain on the circuit board 100. When little to no strain is imposed on the circuit board 100, the amplifier 104 receives a substantially constant output voltage from the bridge network 700. When strain is imposed on the circuit board 100 causing the apparatus 102 to compress and/or deflect, the amplifier 104 detects a change in the output voltage indicating a strain on the circuit board 100. The bridge network 700 may amplify the output voltage prior to being received by the amplifier 104. FIG. 7B shows that the bridge network 700B may be connected to two apparatus 102, where one apparatus 102 may be embedded into the top layer 200 of the circuit board 100 and one apparatus 102 may be embedded into the bottom layer 204 of the circuit board 100.

Although an exemplary embodiment of the invention has been shown and described, many other changes, combinations, omissions, modifications and substitutions, in addition to those set forth in the above paragraphs, may be made by one having skill in the art without necessarily departing from the spirit and scope of this invention. Accordingly, the present invention is not intended to be limited by the preferred embodiments, but is to be defined by reference to the appended claims.

What is claimed is:

1. A device for detecting strain levels imposed on a circuit board, comprising:
    an apparatus mounted on, and integrated with, the circuit board;
    an amplifier for detecting a change in the impedance of the apparatus and generating an output signal representing the change in the impedance of the apparatus; and
    a signal conditioner for receiving the output signal and transmitting the output signal to a receiving device for real-time diagnostics.

2. The device as defined in claim 1, wherein the apparatus is a non-linear metallic trace.

3. The device as defined in claim 1, wherein the apparatus is a trace that is embedded into the circuit board.

4. The device as defined in claim 1, further comprising a bridge network coupled to the apparatus and the amplifier.

5. The device as defined in claim 1, wherein the apparatus is a semiconductor chip capable of sensing strains imposed on the circuit board.

6. The device as defined in claim 1, wherein the apparatus is a trace that is integrated with the circuit board.

7. The device as defined in claim 1, wherein the signal conditioner includes a plurality of capacitors and a plurality of resistors configured to set the gain of the amplifier.

8. The device as defined in claim 1, wherein the apparatus is a strain gage integrated with the circuit board.

9. A system for monitoring the strain levels at particular locations on a circuit board located on a vehicle, comprising:
    a strain indicator embedded into a layer of the circuit board;
    an operational amplifier, mounted on the circuit board, for detecting a change in the resistance of the strain indicator and generating an output signal representing the change in the resistance of the strain indicator; and
    a signal conditioner, mounted on the circuit board, for receiving the output signal and transmitting the output signal to a computer located on the vehicle.

10. The system as defined in claim 9, wherein the operational amplifier amplifies the output signal by a gain value.

11. The system as defined in claim 10, wherein the signal conditioner sets the gain value.

12. The system as defined in claim 9, wherein the strain indicator is selected from a group consisting of a S-shaped trace, a single flat grid, a flattened helix or wraparound grid, an equiangular rosette with adjacent elements and a rectangular rosette with layered elements.

13. The system as defined in claim 9, wherein the strain indicator is a non-linear metallic trace.

14. The system as defined in claim 9, further comprising a bridge network coupled to the strain indicator.

15. A method for monitoring the strain level of a circuit board located on a vehicle, comprising:
    performing a vibration analysis on the circuit board to identify at least one position on the circuit board experiencing a relatively large amount of strain during operation of the vehicle;
    positioning an apparatus on the circuit board at the at least one position identified by the vibration analysis;
    monitoring changes in the resistance of the apparatus using an amplifier, generating an output signal based on the changes in the resistance of the apparatus; and
    transmitting the output signal to a computer on the vehicle.

16. The method as defined in claim 15, wherein the apparatus is a trace integrated with the circuit board.

17. The method as defined in claim 15, wherein the apparatus is selected from a group consisting of a S-shaped trace, a single flat grid, a flattened helix or wraparound grid, an equiangular rosette with adjacent elements and a rectangular rosette with layered elements.

18. The method as defined in claim 15, wherein the apparatus is a semiconductor chip capable of sensing strains imposed on the circuit board.

19. The method as defined in claim 15, further comprising amplifying the output signal.

* * * * *

UNITED STATES PATENT AND TRADEMARK OFFICE
CERTIFICATE OF CORRECTION

PATENT NO. : 6,948,377 B2  
APPLICATION NO. : 10/730410  
DATED : September 27, 2005  
INVENTOR(S) : Wingett et al.

It is certified that error appears in the above-identified patent and that said Letters Patent is hereby corrected as shown below:

Column 1, add the following paragraph between the Title and Technical Field:

--STATEMENT REGARDING FEDERALLY SPONSORED RESEARCH OR DEVELOPMENT

This invention was made with government support under Agreement No. F29601-01-2-0046 awarded by the U.S. Air Force, Air Force Research Laboratory. The government has certain rights in this invention.--

Signed and Sealed this

Twentieth Day of March, 2007

JON W. DUDAS  
*Director of the United States Patent and Trademark Office*